(12) United States Patent
DiFatta et al.

(10) Patent No.: US 7,688,230 B2
(45) Date of Patent: Mar. 30, 2010

(54) SWITCHING DEVICE WITH CRITICAL SWITCH DETECTION

(75) Inventors: Vincenzo DiFatta, Wood Dale, IL (US); Timothy E. Blazier, Elgin, IL (US); Woo Chee Ngai, Singapore (SG)

(73) Assignee: Emerson Electric Co., St. Louis, MO (US)

( * ) Notice: Subject to any disclaimer, the term of this patent is extended or adjusted under 35 U.S.C. 154(b) by 847 days.

(21) Appl. No.: 11/543,304

(22) Filed: Oct. 4, 2006

(65) Prior Publication Data

US 2008/0024326 A1 Jan. 31, 2008

Related U.S. Application Data

(63) Continuation of application No. 11/486,450, filed on Jul. 13, 2006, now abandoned.

(51) Int. Cl.
*H03M 11/00* (2006.01)
(52) U.S. Cl. .............................. 341/22; 341/26; 341/34; 708/131; 708/142
(58) Field of Classification Search .................... 341/22, 341/26, 34; 708/131, 142
See application file for complete search history.

(56) References Cited

U.S. PATENT DOCUMENTS

| | | | | | |
|---|---|---|---|---|---|
| 4,583,189 | A | * | 4/1986 | Koyama | 708/142 |
| 4,872,008 | A | * | 10/1989 | Ohtsuka et al. | 341/26 |
| 4,918,634 | A | * | 4/1990 | Nishimori | 708/142 |
| 4,939,511 | A | * | 7/1990 | Hinckley | 340/825.78 |
| 5,521,575 | A | * | 5/1996 | Pack | 341/26 |
| 5,929,790 | A | * | 7/1999 | Lim | 341/22 |
| 6,970,752 | B1 | * | 11/2005 | Lim et al. | 700/94 |

* cited by examiner

*Primary Examiner*—Timothy Edwards, Jr.
(74) *Attorney, Agent, or Firm*—Harness, Dickey & Pierce, P.L.C.

(57) ABSTRACT

A system is provided comprising a switching device and a response module. The switching device has a critical switch and a plurality of non-critical switches. The switching device generates an analog output voltage based on a switching state of the critical switch and each of the non-critical switches. The response module monitors the analog output voltage. The response module detects when the critical switch is closed, regardless of whether any non-critical switch is closed or any non-critical switch is open.

24 Claims, 10 Drawing Sheets

FIG 1

| Component | Characteristic |
|---|---|
| R1 | 120 Ω |
| R2 | 1,000 Ω |
| R3 | 1,000 Ω |
| R4 | 1,000 Ω |
| R5 | 1,000 Ω |
| R6 | 1,000 Ω |
| R7 | 1,000 Ω |
| R8 | 1,000 Ω |
| R9 | 1,000 Ω |
| R10 | 1,000 Ω |
| R11 | 1,000 Ω |
| R12 | 1,000 Ω |
| R13 | 120 Ω |
| R14 | 10,000 Ω |
| R15 | 10,000 Ω |
| Vcc | 5.45 V |

Vout: single switch closed

| Switch No. | RS1 (Ω) | RS2 (Ω) | RP1 (Ω) | RP2 (Ω) | Vout (V) |
|---|---|---|---|---|---|
| SW1 | 120 | 11,120 | 119 | 5,265 | 5.330 |
| SW2 | 1,120 | 10,120 | 1,007 | 5,030 | 4.541 |
| SW3 | 2,120 | 9,120 | 1,749 | 4,770 | 3.988 |
| SW4 | 3,120 | 8,120 | 2,378 | 4,481 | 3.561 |
| SW5 | 4,120 | 7,120 | 2,918 | 4,159 | 3.203 |
| SW6 | 5,120 | 6,120 | 3,386 | 3,797 | 2.881 |
| SW7 | 6,120 | 5,120 | 3,797 | 3,386 | 2.569 |
| SW8 | 7,120 | 4,120 | 4,159 | 2,918 | 2.247 |
| SW9 | 8,120 | 3,120 | 4,481 | 2,378 | 1.889 |
| SW10 | 9,120 | 2,120 | 4,770 | 1,749 | 1.462 |
| SW11 | 10,120 | 1,120 | 5,030 | 1,007 | 0.909 |
| SW12 | 11,120 | 120 | 5,265 | 119 | 0.120 |

FIG 4

A/D - Normal Mode: single switch closed

| Vout Range | | | Recognized |
| --- | --- | --- | --- |
| Low (V) | Mid (V) | High (V) | Switch No. |
| 5.323 | 5.330 | 5.337 | SW1 |
| 4.525 | 4.541 | 4.556 | SW2 |
| 3.966 | 3.988 | 4.009 | SW3 |
| 3.536 | 3.561 | 3.585 | SW4 |
| 3.176 | 3.203 | 3.229 | SW5 |
| 2.853 | 2.881 | 2.908 | SW6 |
| 2.698 | 2.725 | 2.752 | dead-band |
| 2.542 | 2.569 | 2.597 | SW7 |
| 2.221 | 2.247 | 2.274 | SW8 |
| 1.865 | 1.889 | 1.914 | SW9 |
| 1.441 | 1.462 | 1.484 | SW10 |
| 0.894 | 0.909 | 0.925 | SW11 |
| 0.113 | 0.120 | 0.127 | SW12 |

Vout: stuck switch with critical switch SW1 pressed

| Stuck Switch No. | RS1 (Ω) | RS2 (Ω) | RP1 (Ω) | RP2 (Ω) | Vout (V) when SW1 pressed |
|---|---|---|---|---|---|
| SW2 | 120 | 10,120 | 118.577 | 5,029.82 | 5.32 |
| SW3 | 120 | 9,120 | 118.577 | 4,769.87 | 5.32 |
| SW4 | 120 | 8,120 | 118.577 | 4,481.24 | 5.31 |
| SW5 | 120 | 7,120 | 118.577 | 4,158.88 | 5.30 |
| SW6 | 120 | 6,120 | 118.577 | 3,796.53 | 5.28 |
| SW7 | 120 | 5,120 | 118.577 | 3,386.24 | 5.27 |
| SW8 | 120 | 4,120 | 118.577 | 2,917.85 | 5.24 |
| SW9 | 120 | 3,120 | 118.577 | 2,378.05 | 5.19 |
| SW10 | 120 | 2,120 | 118.577 | 1,749.17 | 5.10 |
| SW11 | 120 | 1,120 | 118.577 | 1,007.19 | 4.88 |

FIG 7

Vout: stuck switch with critical switch SW12 pressed

| Stuck Switch No. | RS1(Ω) | RS2 (Ω) | RP1 (Ω) | RP2 (Ω) | Vout (V) when SW12 pressed |
|---|---|---|---|---|---|
| SW2 | 1,120 | 120 | 1,018.182 | 118.58 | 0.57 |
| SW3 | 2,120 | 120 | 1,927.273 | 118.58 | 0.32 |
| SW4 | 3,120 | 120 | 2,836.364 | 118.58 | 0.22 |
| SW5 | 4,120 | 120 | 3,745.455 | 118.58 | 0.17 |
| SW6 | 5,120 | 120 | 4,654.545 | 118.58 | 0.14 |
| SW7 | 6,120 | 120 | 5,563.636 | 118.58 | 0.11 |
| SW8 | 7,120 | 120 | 6,472.727 | 118.58 | 0.10 |
| SW9 | 8,120 | 120 | 7,381.818 | 118.58 | 0.09 |
| SW10 | 9,120 | 120 | 8,290.909 | 118.58 | 0.08 |
| SW11 | 10,120 | 120 | 9,200 | 118.58 | 0.07 |

FIG 8

A/D – Stuck Switch Mode

| Vout (V) - Low | Vout (V) - High | Recognized Switch No. |
|---|---|---|
| 4.800 | 5.337 | SW1 |
| 0.113 | 0.630 | SW12 |

SWITCHING DEVICE WITH CRITICAL SWITCH DETECTION

FIELD

The present disclosure relates to switching devices and more particularly to a switching device with critical switch closure detection.

BACKGROUND

The statements in this section merely provide background information related to the present disclosure and may not constitute prior art.

Electronic devices, including consumer electronic devices, appliances, and the like, often include a switching device such as a push-button keyboard input device. The keyboard may include electrical switches connected to a series of resistors and an input voltage. Depression of a keyboard push-button or "key" may close one of the switches, thereby generating an analog output voltage. The analog output voltage may be a fraction of the input voltage, depending on the configuration of the switches and resistors. An analog-to-digital converter may convert the analog output voltage to a digital output that corresponds to the depressed key.

Traditionally, switching devices are biased either at the input voltage or at the circuit's ground. Thus, when no keys are pressed, the output of the switching device is either the input voltage or zero volts. When a push-button is pressed, a switch is closed causing an output between zero volts and the input voltage. Control and response circuitry may receive the output and recognize the output voltage as corresponding to the pressed key. The control and response circuitry may include and analog-to-digital converter and/or a control module for controlling a controlled device in response to the voltage output.

Push-buttons, or keyboard keys, may become stuck. In the traditional system, the switching device becomes inoperable when a key is stuck as the output of the switching device also becomes stuck. Pressing another key of the keyboard may cause the switching device to output an analog output voltage that does not correspond to either the pressed key or the stuck key.

Such a switching device may be implemented on an integrated circuit board (IC). The IC hosting the switching device may also host a user display, such as an LED display or an LCD panel. Control and/or response circuitry for the electronic device may be hosted on a separate IC electrically connected to the IC that is hosting the user input switching device and user display.

During use of the electronic device, the two IC's may become disconnected. In the traditional system, the control circuitry is not able to detect the malfunction. When the two IC's are disconnected, the analog output voltage may simply be zero volts or the input voltage, and the control circuitry may simply read the analog output voltage as having received no user input. Thus, the control and/or response circuitry may simply proceed as if no user input has been received and no key has been depressed. In such case, the user is not able to input key presses to the control circuitry to pause operation of the controlled device or to shut down or power-off the controlled device.

SUMMARY

A system comprising a switching device and a response module is provided. The switching device has a critical switch and a plurality of non-critical switches and generates an analog output voltage based on a switching state of the critical switch and each of the plurality of non-critical switches. The response module monitors the analog output voltage and detects when the critical switch is closed regardless of whether any non-critical switch is closed or any non-critical switch is open.

A method for a switching device having a having a critical switch and a plurality of non-critical switches is also provided. The method includes generating an analog output voltage based on a switching state of the critical switch and each of the non-critical switches. The method also includes monitoring the analog output voltage and detecting when the critical switch is closed regardless of whether any non-critical switch is closed or any non-critical switch is open.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features. As used herein, the terms module, control module, and controller refer to an application specific integrated circuit (ASIC), an electronic circuit, a processor (shared, dedicated, or group) and memory that execute one or more software or firmware programs, a combinational logic circuit, and/or other suitable components that provide the described functionality. Further, as used herein, computer-readable medium refers to any medium capable of storing data for a computer. Computer-readable medium may include, but is not limited to, CD-ROM, floppy disk, magnetic tape, other magnetic or optical medium capable of storing data, memory, RAM, ROM, PROM, EPROM, EEPROM, flash memory, punch cards, dip switches, or any other medium capable of storing data for a computer.

Figure 1:
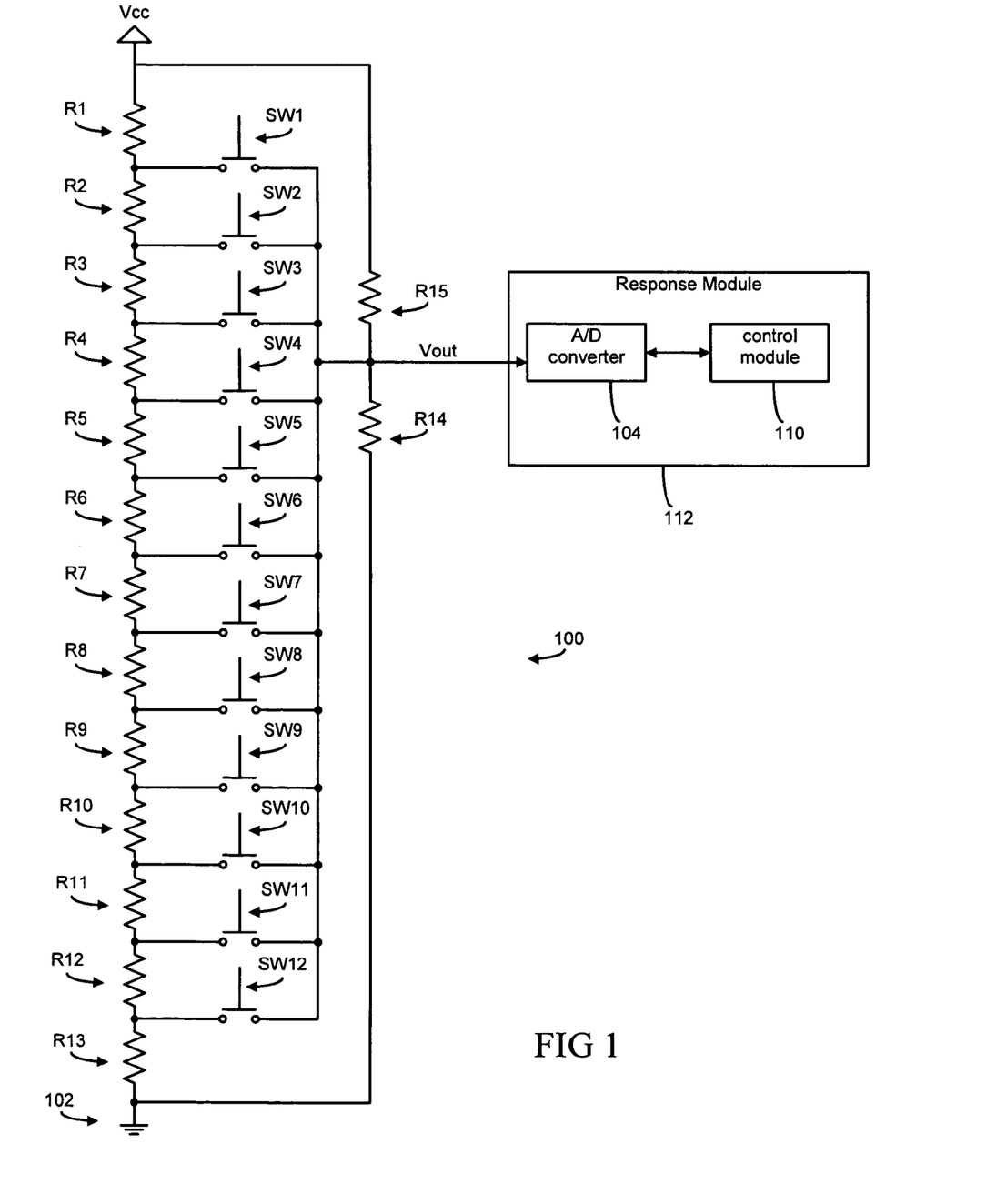
FIG. 1 is a schematic illustration of a switching device.

With reference to FIG. 1, a switching device 100 may include switches SW1 through SW12 and resistors R1 through R15 connected to an input, or supply voltage (Vcc) and a ground 102, or return voltage. The Vcc and the ground 102 may be generally referred to as the supply rails. While the Vcc may be a positive voltage, and while the ground may essentially be at zero volts, other voltage differentials may be used across the supply rails.

The switches, SW1 through SW12, may be normally open switches. The switching device 100 may be connected to a response module 112 including an analog-to-digital (A/D) converter 104 and a control module 110. An analog output voltage (Vout) of the switching device may be received by the A/D converter 104. The A/D converter 104 may convert Vout to a digital output which may be received by the control module.

The switches, SW1 through SW12, may be connected to input keys of an electronic device. For example, the switching device may be used in connection with an appliance, such as a dishwasher, oven, stove, washing machine, dryer, or the like. User input may be received via depression of keys associated with each of the switches, SW1 through SW 12. For example, with reference to FIG. 11, user keys may include numerical keys, zero through nine, and function keys, such as "pause" and "power." The keys may be located proximate to a user display 120, such as an LED or LCD display.

Figure 2:
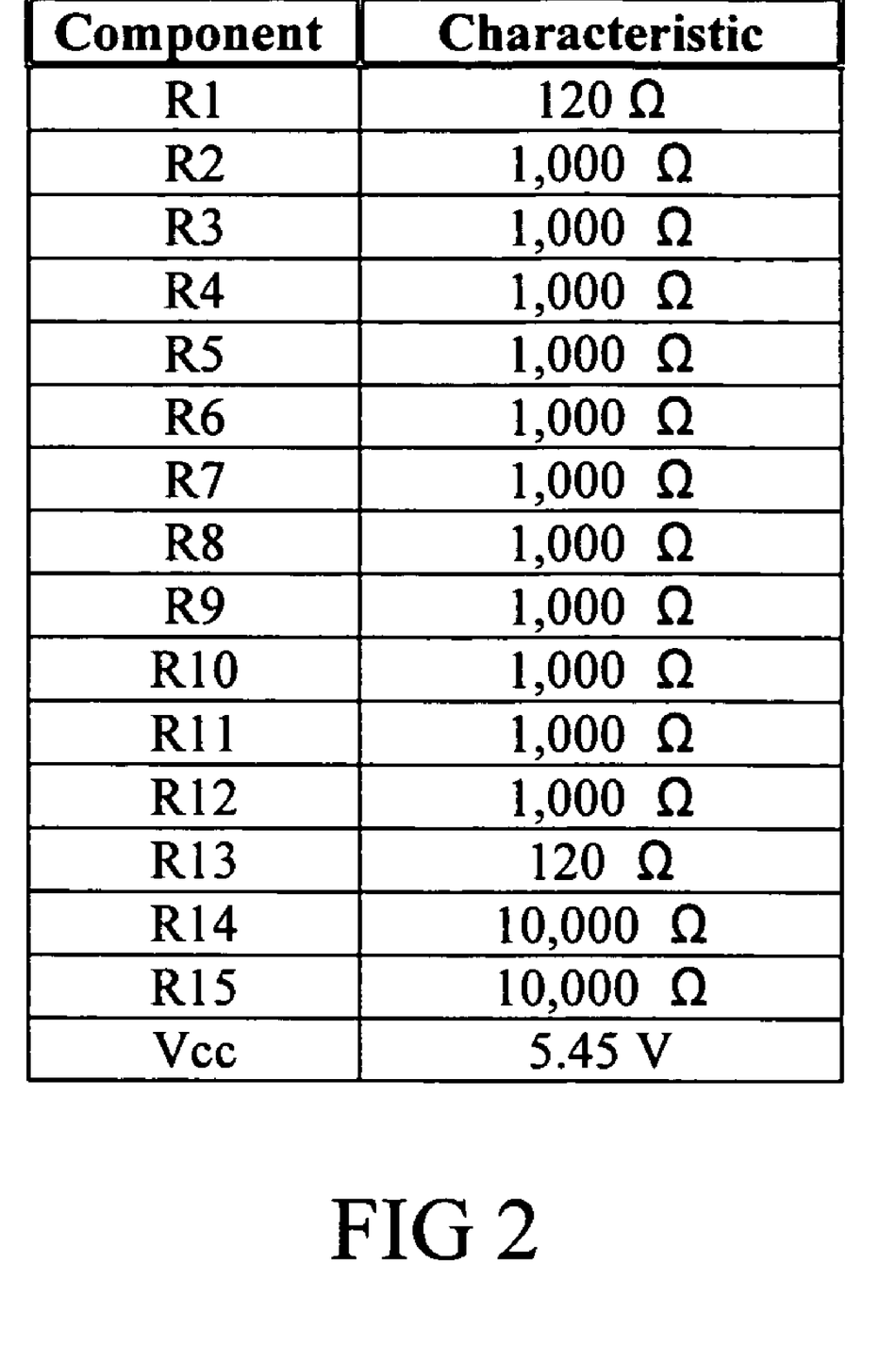
FIG. 2 is a table illustrating component characteristics of a switching device.

With reference to FIG. 2, electrical characteristics of the components of the switching device depicted in FIG. 1 are shown. As shown, resistors R1 and R13 may be 120 ohm resistors. Resistors R2 through R12 may be 1,000 ohm resistors. Resistors R14 and R15 may be 10,000 ohm resistors. As described in more detail below, R14 and R15 are "critical" resistors. The input voltage, Vcc, may be 5.45 volts. As can be appreciated, other components with different electrical characteristics may be used to accomplish the functionality described by the present teachings. Specifically, Vcc may be greater or less than 5.45 volts. Additionally, other resistors of varying resistance, greater or less than that described by FIG. 2, may be used. Further, while the switching device of FIG. 1 is shown with twelve switches, SW1 through SW12, more or less switches may be used.

Generally, the resistance of the critical resistors, R14 and R15, is much larger than the resistance of resistors R1 through R13. As described in more detail below, R14 and R15 cause Vout to be biased between zero volts and Vcc. The large R14 and R15 resistors render the end switches, SW1 and SW12, "critical" switches. When one of the "non-critical" switches, SW2 through SW11, is stuck closed, the A/D converter and control module may still be able to recognize when SW1 or SW12 is closed by a user key press.

When none of the switches SW1 through SW12 are closed, the switching device functions as a voltage divider, and Vout may be calculated according to the following formula:

$$Vout = \frac{R14}{R14 + R15} \times Vcc. \tag{1}$$

Thus, with R14 and R15 each at 10,000 ohms, and with Vcc at 5.45 volts, when none of the switches SW1 through SW12 are closed, Vout is 2.725 volts.

Figure 3:
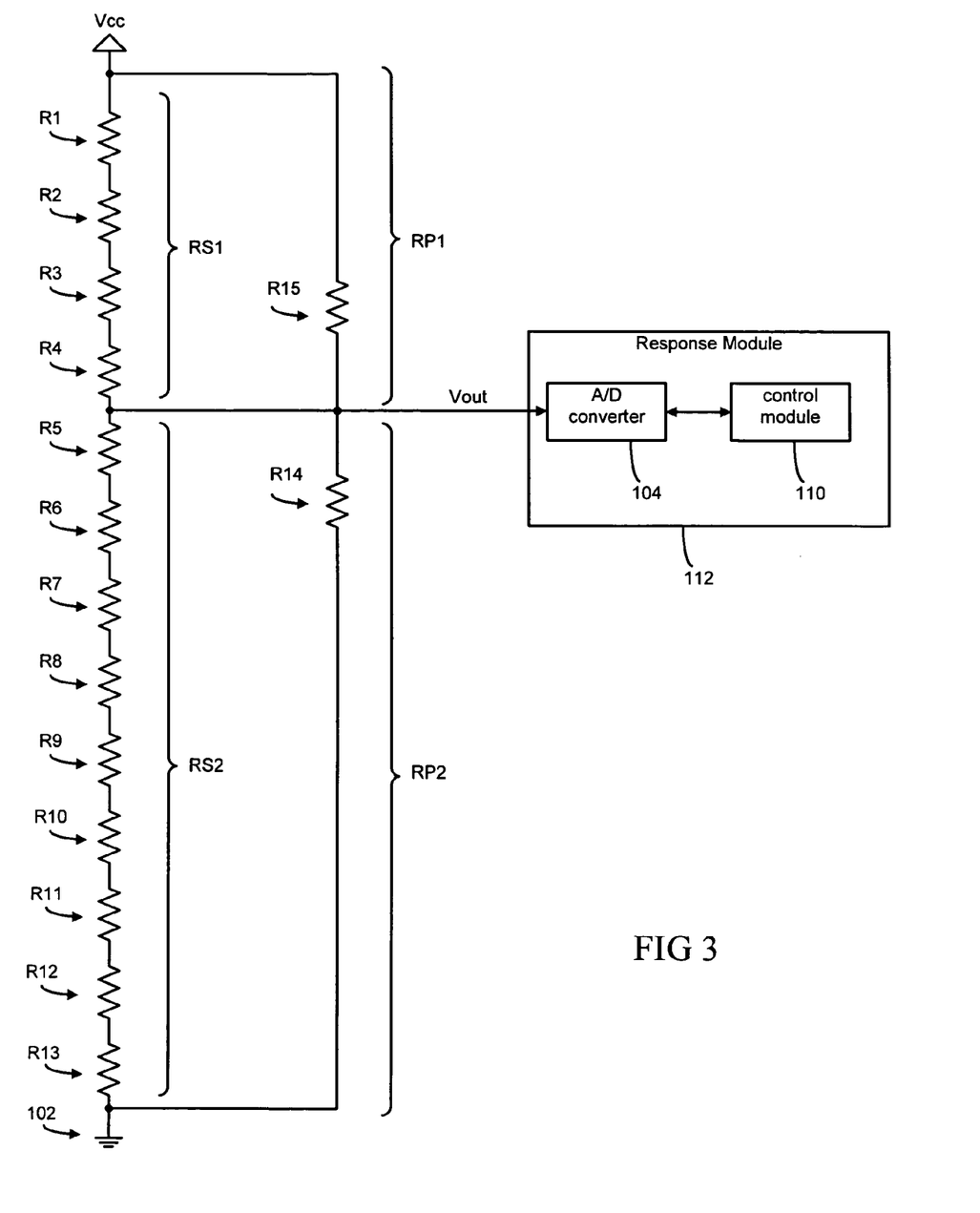
FIG. 3 is a schematic illustration of a switching device with equivalent series and parallel circuit labels.

When one of the switches SW1 through SW12 is closed, Vout may be calculated with reference to the equivalent series and parallel resistances. With reference to FIG. 3, when SW4 is closed, the series resistors R1 through R13 may be grouped into first and second series resistance groups, RS1 and RS2.

RS1 is the series equivalent resistance of the resistors "above" the closed switch. RS2 is the series equivalent of the resistors "below" the closed switch. RS1 and RS2 may be calculated based on the following formulas:

$$RS1 = R1 + \ldots + RN; \tag{2}$$

$$RS2 = R(N+1) + \ldots + R13; \tag{3}$$

where N corresponds to the number of the closed switch. When SW4 is closed, RS1=R1+R2+R3+R4=3,120 ohms. When SW4 is closed, RS2=R5+R6+R7+R8+R9+R10+R11+R12+R13=8,120 ohms.

With continued reference to FIG. 3, RP1 is the parallel equivalent resistance of R15 and RS1. RP2 is the parallel equivalent resistance of R14 and RS2. RP1 and RP2 may be calculated based on the following formulas:

$$RP1 = \frac{RS1 \times R15}{RS1 + R15}; \tag{4}$$

$$RP2 = \frac{RS2 \times R14}{RS2 + R14}. \tag{5}$$

Based on the foregoing equations (1) through (5), when a switch is closed, Vout may be calculated based on the following formula:

$$Vout = \frac{RP2}{RP1 + RP2} \times Vcc \tag{6}$$

Figure 4:
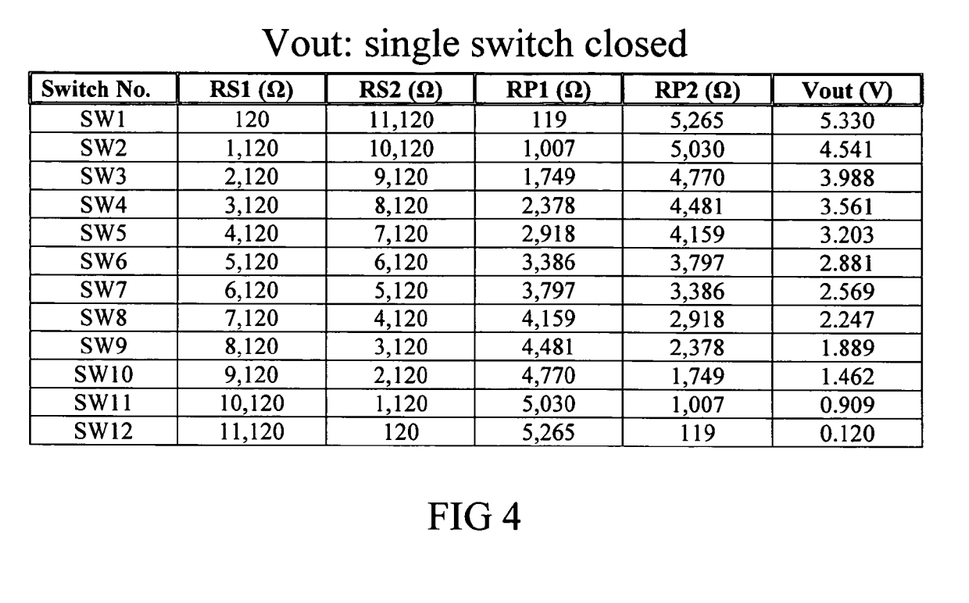
FIG. 4 is a table illustrating Vout when switches of a switching device are closed.

With reference to FIG. 4, RS1, RS2, RP1, RP2, and Vout are shown when each of switches SW1 through SW12 is independently closed, given the component characteristics illustrated in FIG. 2. For example, when SW4 is closed RS1 is 3,120 ohms, RS2 is 8,120 ohms, RP1 is 2,378 ohms, RP2 is 4,481 ohms, and Vout is 3.561 volts. FIG. 4 assumes ideal resistances. In practice, the resistors R1 through R15 may not be at the exact resistances illustrated in FIG. 2. As described in more detail below, the switching device allows for a certain amount of resistance error tolerance. The resistance error tolerance may be governed by the number of switches included in the switching device, and the resolution of the A/D converter 104.

Figure 5:
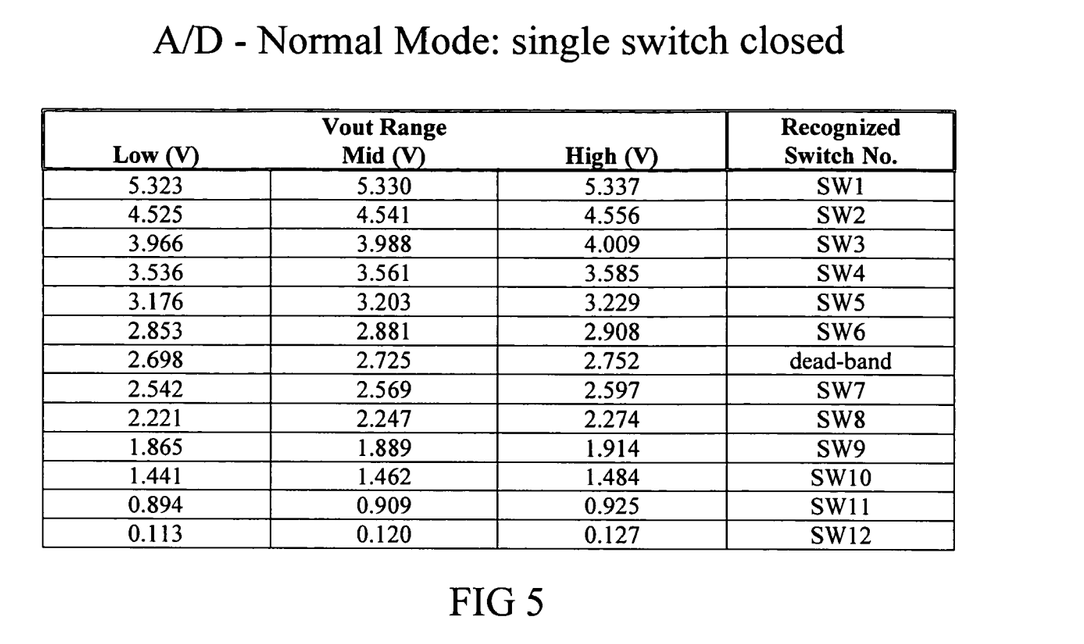
FIG. 5 is an A/D conversion table for a switching device.

With reference to FIG. 5, a conversion table for an A/D converter 104 operating in a "normal mode" is shown. As described in more detail below, the A/D converter 104 may also be operated in a "stuck key" mode. In normal mode, voltage ranges are associated with each of the switches SW1 through SW12 as well as a "dead-band". The dead-band corresponds with the Vout when all of the switches are open.

As shown in FIG. 5, the A/D converter compares Vout with a number of Vout ranges. The Vout ranges allow for resistance error. Tolerances may be specified for the resistors R1 through R15. The resistance of R1 and R13 may be accurate to within a tolerance of five percent of the resistances specified by FIG. 2. The resistance of the remaining resistors may be accurate to within a tolerance of one percent of the resistance specified by FIG. 2.

Operating in normal mode, the AND converter 104 receives Vout from the switching device 100 and outputs a digital signal corresponding to the specified Vout voltage range. As shown in FIG. 5, when the Vout received by the A/D converter 104 falls between 3.536 volts and 3.585 volts, the A/D converter 104 outputs a digital signal corresponding to SW4. When the Vout received by the A/D converter 104 falls between 2.698 volts and 2.752 volts, i.e., the dead-band, the A/D converter 104 outputs a digital signal indicating that all switches are open.

The A/D converter 104 may accomplish an analog-to-digital conversion by way of a volts-per-bit calculation. The A/D converter 104 may output a 10 bit digital signal. The A/D converter 104 may use a volts-per-bit constant, such as 0.00532227 volts-per-bit. When the A/D converter 104 receives a Vout of 3.561 volts, the A/D converter 104 may calculate a corresponding bit output of 669 (base-10), or 1010011101 (binary). As can be appreciated, other bit resolutions for the A/D converter 104, and other methods of analog-to-digital conversion may be used.

Figure 6:
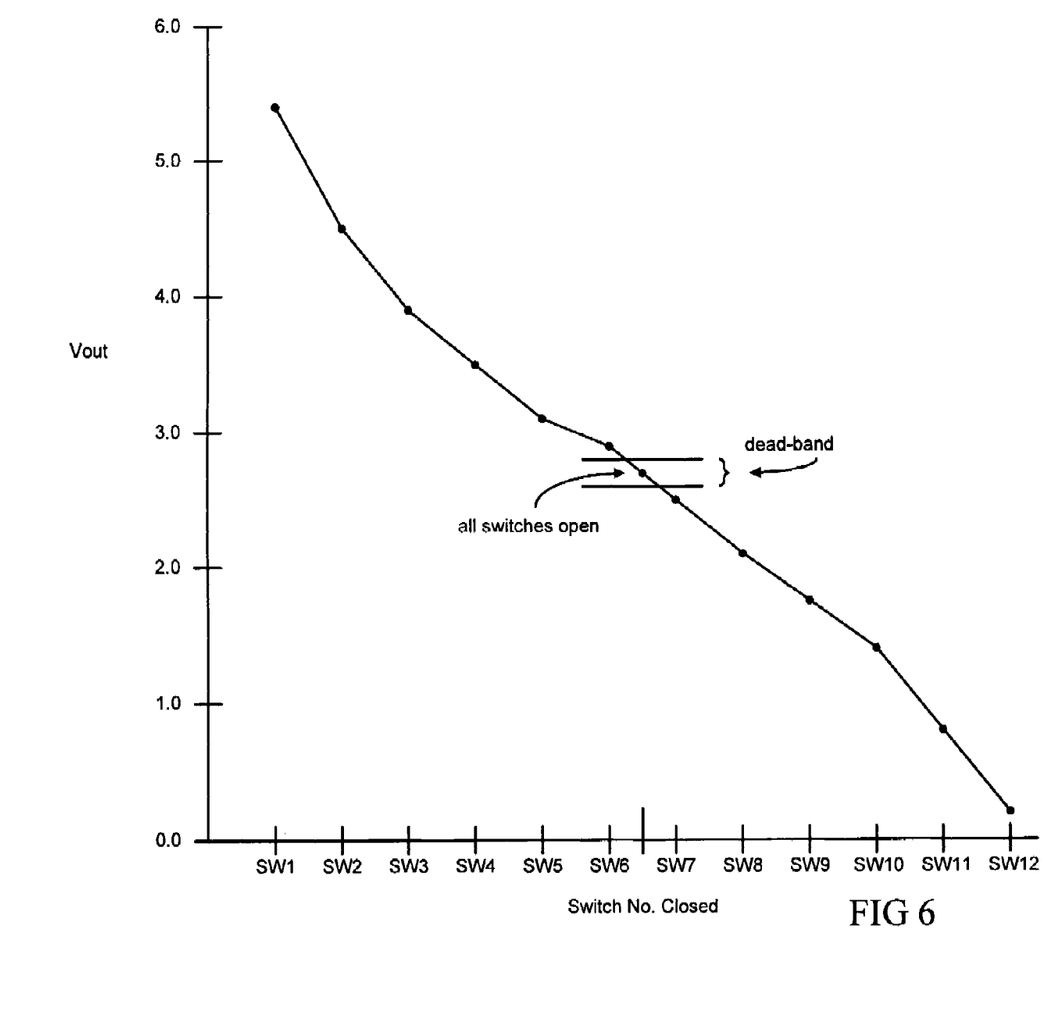
FIG. 6 is a graphical illustration of an A/D conversion table for a switching device.

With reference to FIG. 6, a graph illustrates Vout when each of switches SW1 through SW 12 is closed. Additionally, the dead-band is illustrated. The dead-band falls between the Vout corresponding with closure of switches SW6 and SW7.

Figure 7:
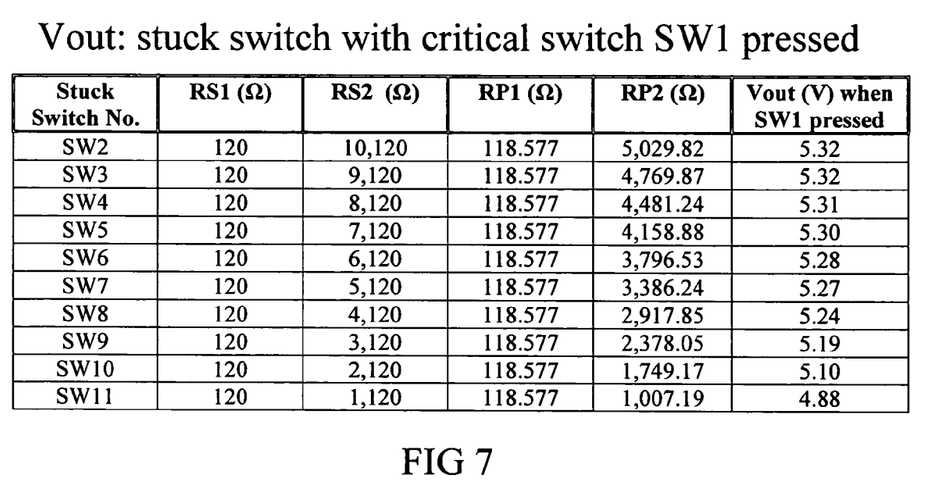
FIG. 7 is a table illustrating Vout when a switch is stuck and when a critical switch is closed.
Figure 8:
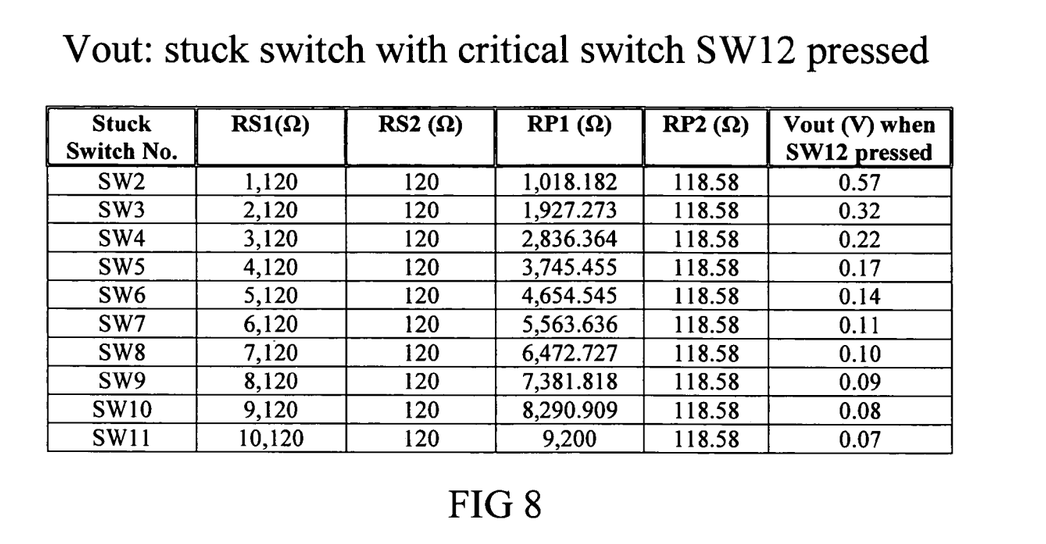
FIG. 8 is another table illustrating Vout when a switch is stuck and when a critical switch is closed.

The switching device 100 includes two critical switches, SW1 and SW12. The closure of the critical switches is recognized even when one of the non-critical switches is stuck closed. With reference to FIGS. 7 and 8, Vout is shown when each of switches SW2 through SW11 is stuck closed and when SW1 and SW12 are closed. When SW4 is stuck closed, and no other switches are closed, Vout will remain at 3.561 volts, as shown in FIG. 4. In the traditional switching system, the device would now be inoperable with the switch stuck closed. No other switch closures would be recognizable.

As shown in FIGS. 7 and 8, when any of keys SW2 through SW11 are stuck closed, closure of SW1 and SW12 are still recognized. In the above example, when SW4 is stuck closed, closing SW1 causes Vout to change to 5.31 volts. Likewise, when SW4 is stuck closed, closing SW12 causes Vout to change to 0.22 volts.

Figure 9:
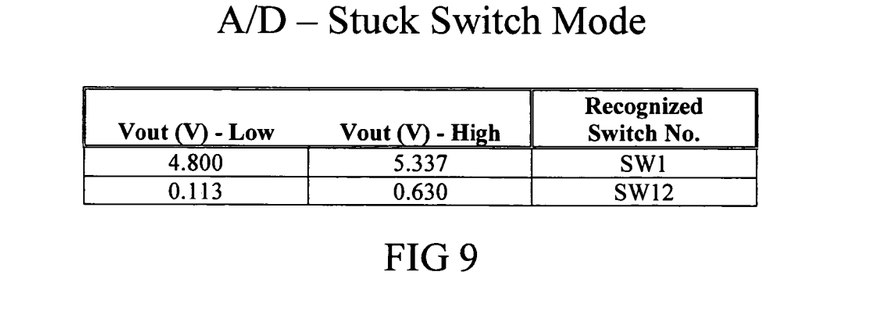
FIG. 9 is an A/D conversion table for a stuck switch mode.

When any of switches SW2 though SW11 are stuck closed, the control module 110 may recognize the sustained Vout, and may enter stuck switch mode. As shown in FIG. 9, in stuck switch mode, the Vout ranges for SW1 and SW12 are widened. For SW1, a Vout of between 4.800 volts and 5.337 volts is recognized as an SW1 closure. For SW12, a Vout of between 0.113 volts and 0.630 volts is recognized as an SW12 closure.

Continuing with the above example, when SW4 is stuck closed, closing SW 1 causes Vout to change to 5.31 volts and closing SW12 causes Vout to change to 0.22 volts. As shown in FIG. 9, these are recognized as SW1 and SW12 closures, respectively.

In this way, even when a non-critical switch, such as SW2 through SW11, is stuck closed, the control module is able to recognize closure of a critical switch, such as SW1 or SW12. The critical switches may correspond with certain critical functions such as "power off" or "pause". For example, in an appliance such as a dishwasher, the user may be able to turn the dishwasher off, or pause a dishwasher cycle, regardless of whether one of the other input keys is malfunctioning and stuck.

When one of the critical switches becomes stuck, the control module 110 simply shuts down the controlled device. If, for example, the "pause" button on the dishwasher becomes stuck, the control module 100 simply shuts the dishwasher off until the stuck switch condition is repaired.

Figure 10:
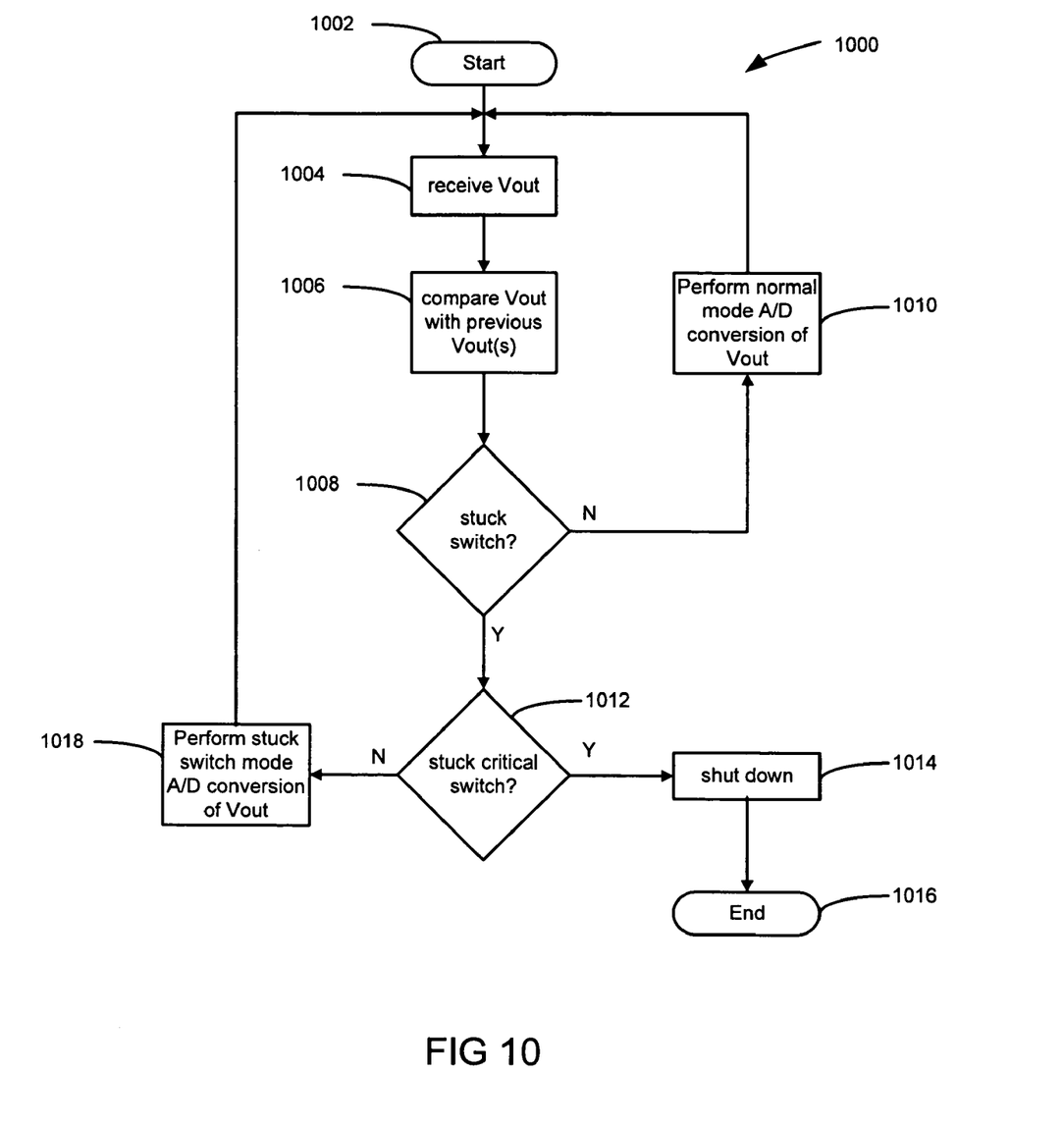
FIG. 10 is a flow chart illustrating a control algorithm for a switching device.

With reference to FIG. 10, a control algorithm 1000 for a controlled device with a switching device 100 is shown. The control module 110 and A/D converter 104 execute the control algorithm 1000. Control begins in step 1002. In step 1004, the analog Vout is received from the switching device 100. In step 1006, Vout is compared with previous Vout(s). If Vout has remained the same for a predetermined time, a stuck switch condition may exist. In step 1008, the control module 110 determines whether a stuck switch condition exists, based on the comparison made in step 1006.

When a stuck switch condition does not exist, a normal mode A/D conversion of Vout is performed in step 1010. The normal mode conversion is made according to the table depicted in FIG. 5. Control proceeds to step 1004. Operation continues and the next analog Vout is received in step 1004.

In step 1008, when a stuck switch condition exists, control proceeds to step 1012. In step 1012, the control module 110 determines whether the stuck switch is a stuck critical switch. When the stuck switch is a stuck critical switch, control proceeds to step 1014 and shuts down the controlled device, such as the appliance, and ends in step 1016.

In step 1012, when the stuck switch is not a critical switch, a stuck switch mode AND conversion is performed in step 1018. The stuck switch mode AND conversion is made according to the table depicted in FIG. 9. In stuck switch mode, the control module 110 and A/D converter 104 detect only critical switch closures. Voltages corresponding with other non-critical switch closures are ignored. Control then loops back to step 1004 and the algorithm 1000 is started anew.

When the stuck switch becomes un-stuck, the control module 110 and A/D converter 104 perform normal mode AND conversion of Vout once again in step 1010. When the stuck switch remains stuck, the control module waits for closure of a critical switch by performing the stuck switch mode A/D conversion in step 1018.

In this way, a controlled device configured with the switching device 100 according to the present teaching is able to receive critical switch input regardless of whether the non-critical keys are pressed or stuck. The switching device allows the controlled device to continue functioning during a partial malfunction such as a stuck key. Additionally, the switching device with critical keys may be used to facilitate certain special functions. For example, by pressing a critical key in combination with another non-critical key, the control module may enter a special mode, such as a safety, setup, or lock-out mode.

Figure 11:
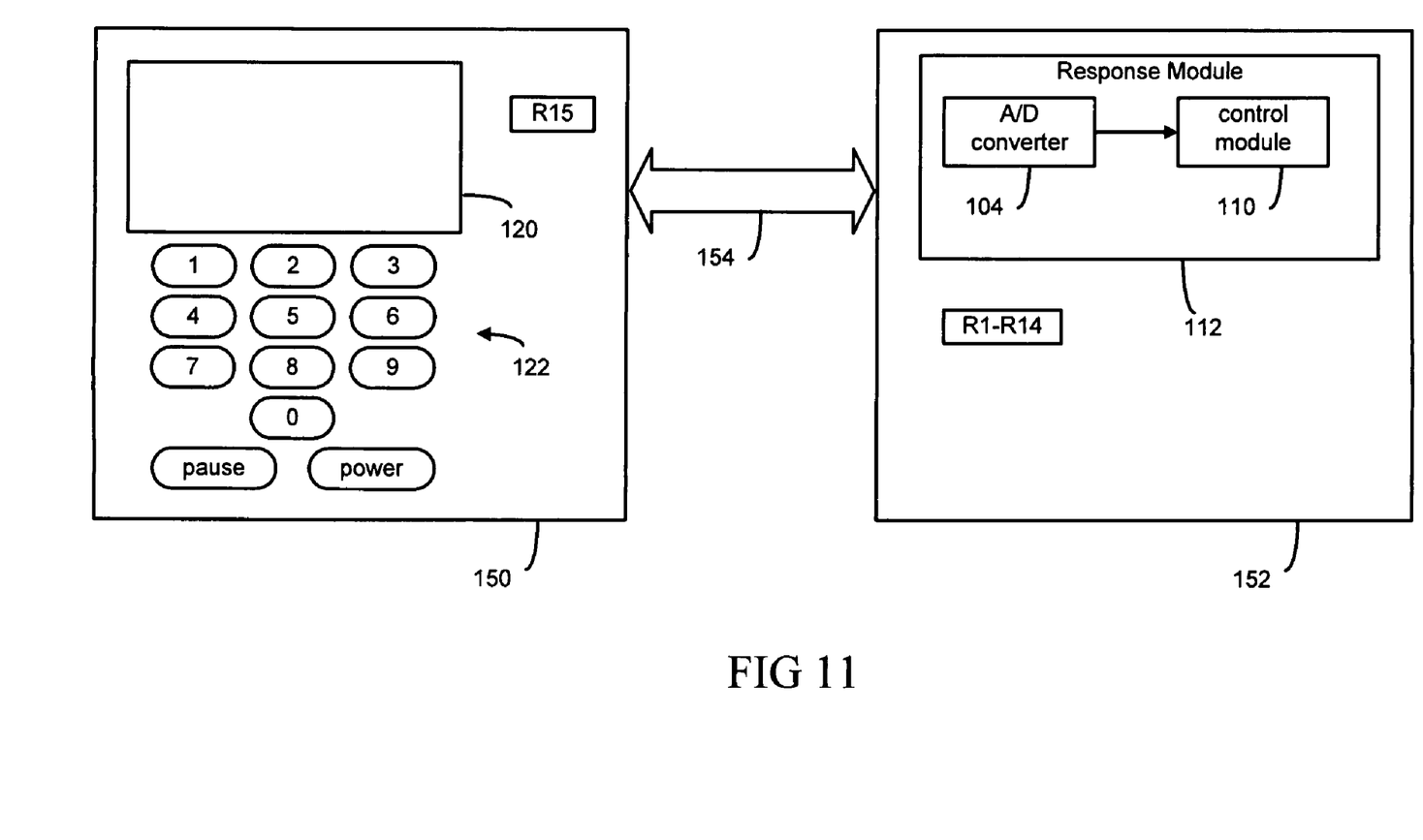
FIG. 11 is a schematic illustration of a switching device, A/D converter, and control module.

Referring now to FIG. 11, the switching device, the A/D converter, and the control module may be hosted on more than one IC. The critical resistors, R14 and R15, may be contained on different IC's. For example, the switches SW1 through SW12 and resistor R15 may be contained on a first IC 150 along with a user display device 120 and a keyboard device 122. The A/D converter 104, control module 110, and resistors R1 through R14 may be contained on a second IC 152. The first IC 150 and the second IC 152 may be connected by a ribbon cable 154 or other suitable electrical connection device. The first IC 150 may be located such that the keyboard 122 and the user display 120 are easily accessible and viewable by the user. The second IC 152 may be located elsewhere. The control module 110 may include a processor, random access memory (RAM), and read only memory (ROM), as well as other electronic components necessary for operation of the device. Thus, the second IC 152 may be located in a housing located elsewhere on the appliance. For example, the second IC 152 may be located to allow sufficient cooling of the processor.

In a multiple IC board implementation, the IC boards may become disconnected. In such case, the keyboard 122 and user display 120 may become disconnected from the A/D converter 104 and control module 110. In the traditional system, when the IC's become disconnected, Vout either pulls to zero volts or Vcc, and the A/D converter 104 treats the received Vout as if no user input has been received. In other words, the traditional system continues operation when the IC's have become disconnected and the keyboard 122 is no longer connected to the A/D converter 104 and control module 110.

When the first IC 150 and the second IC 152 of the present teachings are disconnected, however, the control module 110 halts operation of the controlled device. When resistors R14 and R15 are located on separate IC boards, and when the IC boards become disconnected, Vout pulls to either zero volts or Vcc. In such case, the A/D converter 104 and control module 110 read the Vout as a stuck critical switch.

As shown in FIG. 10, when a stuck critical switch is detected, the control module 110 shuts down the controlled device. In other words, a disconnected keyboard condition is treated in the same manner as a stuck critical key condition. In both cases, the fault causes the control module 110 to halt operation and shut down the controlled device, such as the appliance.

While the exemplary embodiment of a switching device has been described above with a specific configuration, this system may be constructed with many different configurations and components as necessary or desired for a particular application. The above configurations and components are presented only to describe one particular embodiment and should be viewed as illustrating, rather than limiting, the present teachings. Thus, the description is merely exemplary in nature and variations that do not depart from the gist of the present teachings are intended to be within the scope of the teachings. Such variations are not to be regarded as a departure from the spirit and scope of the present teachings.

What is claimed is:

1. A system comprising:
    a switching device having a first critical switch and a plurality of non-critical switches, that generates an analog output voltage based on a switching state of said first critical switch and each of said plurality of non-critical switches, and
    a response module that monitors said analog output voltage,
    wherein said response module detects when said first critical switch is closed regardless of whether any non-critical switch is closed or any non-critical switch is open.

2. The system of claim 1 wherein said switching device is connected to a supply voltage and a return voltage and generates said analog output voltage within a pre-determined voltage range between said supply voltage and said return voltage when said first critical switch and each of said plurality of non-critical switches are open.

3. The system of claim 1 wherein said switching device is connected to a supply voltage and a return voltage and generates said analog output voltage between said supply voltage and a predetermined upper voltage threshold when said first critical switch is closed.

4. The system of claim 1 wherein said switching device is connected to a supply voltage and a return voltage and generates said analog output voltage between said return voltage and a predetermined lower voltage threshold when said first critical switch is closed.

5. The system of claim 1 further comprising a second critical switch wherein said switching device is connected to a supply voltage and a return voltage and generates said analog output voltage between said supply voltage and a predetermined upper voltage threshold when said first critical switch is closed and between said return voltage and a predetermined lower voltage threshold when said second critical switch is closed.

6. The system of claim 5 wherein said switching device generates said analog output voltage within a pre-determined voltage range between said supply voltage and said return voltage when said first critical switch, said second critical switch and each of said plurality of non-critical switches are open.

7. The system of claim 1 wherein said response module includes an analog-to-digital converter that converts said analog output voltage to a digital signal.

8. The system of claim 7 wherein said response module includes a control module that receives said digital signal and that controls a controlled device based on said digital signal.

9. The system of claim 8 wherein said control module detects when said first critical switch is stuck closed.

10. The system of claim 9 wherein said control module shuts down said controlled device when said first critical switch is stuck closed.

11. The system of claim 8 wherein said control module detects when at least one of said plurality of non-critical switches is stuck closed.

12. The system of claim 11 wherein said response module operates in a stuck-switch mode when said control module detects at least one of said plurality of non-critical switches is stuck closed.

13. The system of claim 2 further comprising a first critical resistor connected in series between a supply voltage connection carrying said supply voltage and an output connection carrying said analog output voltage and a second critical resistor connected in series between a return voltage connection carrying said return voltage and said output connection.

14. The system of claim 13 wherein said first critical switch, said plurality of non-critical switches, and said first critical resistor are contained on a first integrated circuit board, wherein said response module and said second critical resistor are contained on a second integrated circuit board, and wherein when said first integrated circuit board is disconnected from said second integrated circuit board, said analog output voltage is equivalent to said supply voltage.

15. The system of claim 13 wherein said first critical switch, said plurality of non-critical switches, and said second critical resistor are contained on a first integrated circuit board, wherein said response module and said first critical resistor are contained on a second integrated circuit board, and wherein when said first integrated circuit board is disconnected from said second integrated circuit board, said analog output voltage is equivalent to said zero volts.

16. For a switching device having a having a critical switch and a plurality of non-critical switches, a method comprising:
    generating an analog output voltage based on a switching state of said critical switch and each of said plurality of non-critical switches, and
    monitoring said analog output voltage,
    detecting when said first critical switch is closed regardless of whether any non-critical switch is closed and any non-critical switch is open.

17. The method of claim 16 wherein said generating said analog output voltage includes generating said analog output voltage within a predetermined voltage range between a supply voltage and a return voltage when said critical switch and each of said plurality of non-critical switches are open.

18. The method of claim 16 wherein said generating said analog output voltage includes generating said analog output voltage between a supply voltage and a predetermined upper voltage threshold when said first critical switch is closed.

19. The method of claim 16 wherein said generating said analog output voltage includes generating said analog output voltage between a return voltage and a predetermined lower voltage threshold when said first critical switch is closed.

20. The method of claim 16 further comprising converting said analog output voltage to a digital signal with an analog-to-digital converter.

21. The method of claim 20 further comprising controlling a controlled device with a control module based on said digital signal.

22. The method of claim 21 further comprising detecting when said critical switch is stuck closed.

23. The method of claim 22 further comprising shutting down said controlled device when said critical switch is stuck closed.

24. The method of claim 21 further comprising detecting when at least one of said plurality of non-critical switches is stuck closed.

* * * * *

UNITED STATES PATENT AND TRADEMARK OFFICE
CERTIFICATE OF CORRECTION

PATENT NO.        : 7,688,230 B2
APPLICATION NO. : 11/543304
DATED             : October 4, 2006
INVENTOR(S)       : Vincenzo DiFatta et al.

It is certified that error appears in the above-identified patent and that said Letters Patent is hereby corrected as shown below:

Column 4,
Line 62, "AND," should be --A/D--.

Column 6,
Line 17, "AND" should be --A/D--.
Line 18, "AND" should be --A/D--.
Line 26, "AND" should be --A/D--.

Signed and Sealed this

Thirtieth Day of November, 2010

David J. Kappos
*Director of the United States Patent and Trademark Office*